(12) United States Patent
Devins et al.

(10) Patent No.: US 6,427,224 B1
(45) Date of Patent: Jul. 30, 2002

(54) METHOD FOR EFFICIENT VERIFICATION OF SYSTEM-ON-CHIP INTEGRATED CIRCUIT DESIGNS INCLUDING AN EMBEDDED PROCESSOR

(75) Inventors: Robert J. Devins, Essex Junction; Mark E. Kautzman, Colchester; Kenneth A. Mahler, Essex Junction; David W. Milton, Underhill, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/494,564

(22) Filed: Jan. 31, 2000

(51) Int. Cl.$^7$ ................................................ G06F 17/50
(52) U.S. Cl. ................................................ 716/4; 716/5
(58) Field of Search ................................ 716/4, 5, 6, 7; 703/13–17

(56) References Cited

U.S. PATENT DOCUMENTS

| | | | | |
|---|---|---|---|---|
| 5,600,579 | A | | 2/1997 | Steinmetz, Jr. ............. 364/578 |
| 5,838,948 | A | | 11/1998 | Bunza ........................ 395/500 |
| 6,052,524 | A | * | 4/2000 | Pauna ..................... 395/500.43 |
| 6,240,543 | B1 | * | 5/2001 | Bhandari ..................... 716/18 |
| 6,249,893 | B1 | * | 6/2001 | Rajsuman et al. .......... 714/741 |
| 6,269,467 | B1 | * | 7/2001 | Chang et al. .................. 716/1 |

OTHER PUBLICATIONS

Shah et al, "Target Processor and Co–Verification Environment Independent Adapter—A Technoligy to Shorten Cycle–Time for Retargeting T1 Processor Simulators in HW/SW Co–Verification Environments," IEEE, Sep. 1999, pp. 37–41.*

Clement et al, "Fast Prototyping: A System Design Flow Applied to a Complex System–on–Chip Multiprocessor Design," IEEE, Jun. 1999, pp. 420–424.*

Bill Cordan, "An Efficient Bus Architecture for System–on–Chip Design," IEEE, May 1999, pp. 623–626.*

Arnold S. Berger, "Applying Hardware/Software Co–Design to Systems–on–a–Chip," IEEE, Sep. 1998, pp. 22–28.*

Chauhan et al, "Verifying IP–Core Based System–on–Chip Designs," IEEE, Sep. 1999, pp. 27–31.*

Bulent Dervisoglu, "Design for Testability: It is Time to Deliver it for Time–to–Market," IEEE, Sep. 1999, pp. 1102–1111.0.*

* cited by examiner

Primary Examiner—Vuthe Siek
(74) Attorney, Agent, or Firm—Connolly Bove Lodge & Hutz, LLP; Richard M. Kotulak, Esq.

(57) ABSTRACT

A method for using verification software for testing a system-on-chip (SOC) design including an embedded processor. The verification software is used to generate and apply test cases to stimulate the SOC design in simulation; the results are observed and used to de-bug the design. Verification of a SOC design which includes an embedded processor is typically very slow. To provide for a speed-up mode of verification in such a case, in the method of the present invention, verification software is partitioned into higher-level control code and lower-level device driver code. The higher-level code performs such functions as decision-making, test initialization, test randomization, multi-tasking, and comparison of test results with expected results. The low-level code interfaces with a core being simulated, to apply the test case generated by the upper-level code on a hardware level of operations. The partitioning of the verification software as described above allows for a "split-domain" mode of verification in which only the low-level code is executed by a simulated processor model, while the rest of the code executes externally to the simulator. Because most of the verification software executes externally to the simulator while only the low-level code executes on the simulated processor, the overhead of performing the high-level functions is removed from the simulator. As a result, faster verification is enabled.

26 Claims, 13 Drawing Sheets

METHOD FOR EFFICIENT VERIFICATION OF SYSTEM-ON-CHIP INTEGRATED CIRCUIT DESIGNS INCLUDING AN EMBEDDED PROCESSOR

CROSS REFERENCE TO RELATED APPLICATIONS

This application is related by common inventorship and subject matter to co-pending applications titled "Method of Controlling External Models in System-On-Chip Verification", Ser. No. 09/494,230 "Simulator-Independent System-On-Chip Verification Methodology", Ser. No. 09/494,465 "Method of Developing Re-Usable Software for Efficient Verification of System-On-Chip Integrated Circuit Designs", Ser. No. 09/494,907 "Processor-Independent System-On-Chip Verification for Embedded Processor Systems", Ser. No. 09/494,386 and "Method for Re-Using System-On-Chip Verification Software in an Operating System" Ser. No. 09/494,236. The listed applications are assigned to International Business Machines Corporation and are entirely incorporated herein by this reference.

BACKGROUND OF THE INVENTION

The present invention relates to the testing of computer system designs by software simulation, and more particularly to a verification methodology which increases the efficiency of verification of system-on-chip (SOC) designs which include an embedded processor.

The complexity and sophistication of present-day integrated circuit (IC) chips have advanced significantly over those of early chip designs. Where formerly a chip might embody relatively simple electronic logic blocks effected by interconnections between logic gates, currently chips can include combinations of complex, modularized IC designs often called "cores" which together constitute an entire "system-on-a-chip", or SOC.

In general, IC chip development includes a design phase and a verification phase for determining whether a design works as expected. The verification phase has moved increasingly toward a software simulation approach to avoid the costs of first implementing designs in hardware to verify them.

A key factor for developers and marketers of IC chips in being competitive in business is time-to-market of new products; the shorter the time-to-market, the better the prospects for sales. Time-to-market in turn depends to a significant extent on the duration of the verification phase for new products to be released.

As chip designs have become more complex, shortcomings in existing chip verification methodologies which extend time-to-market have become evident.

Typically, in verifying a design, a simulator is used. Here, "simulator" refers to specialized software whose functions include accepting software written in a hardware description language (HDL) such as Verilog or VHDL which models a circuit design, and using the model to simulate the response of the design to stimuli which are applied by a test case to determine whether the design functions as expected. The results are observed and used to de-bug the design.

In order to achieve acceptably bug-free designs, verification software must be developed for applying a number of test cases sufficient to fully exercise the design in simulation. In the case of SOC designs, the functioning of both the individual cores as they are developed, and of the cores interconnected as a system must be verified. Moreover, a complete SOC design usually includes an embedded processor core; simulation which includes a processor core tends to require an inordinate amount of time and computing resources, largely because the processor is usually the most complex piece of circuitry on the chip and interacts with many other cores.

Typically, verification of a SOC which includes an embedded processor core involves using a simulator to simulate software models of the processor and a memory for containing instructions for execution by the processor. Processor-specific instructions are loaded into the memory model, and the simulator simulates execution of the instructions by the processor model, which typically includes interaction by the processor model with other cores in the overall SOC.

Because processor-specific instructions (i.e., instructions in the processor's native assembly language) are low-level, a number of instructions are typically required to perform a function which could otherwise be implemented in a single high-level instruction. Moreover, for accurate simulation, many simulation cycles are required for each processor-specific instruction. As cores are added to a design and verification programs grow in complexity, the simulation time required for verification approaches a prohibitive level. Most commercially available simulators do not provide the processing power to effectively verify an SOC including an embedded processor in a timely manner using the above-described approach. Thus, a verification engineer must either extend the verification phase to unacceptable lengths or end verification prior to fully exercising the design.

It can be appreciated from the foregoing that verification of an SOC can severely impact time-to-market, in particular when the SOC design includes an embedded processor core, as noted above. Accordingly, a verification methodology is needed which addresses the problems described above.

SUMMARY OF THE INVENTION

In a method according to the present invention, verification software for testing a SOC design including an embedded processor core is partitioned into high-level control code and low-level device driver code. The high-level code performs such functions as decision-making, test initialization, test randomization, multi-tasking, and comparison of test results with expected results. The low-level code interfaces with a core being simulated, to apply the test case generated by the upper-level code on a hardware level of operations.

The partitioning of the verification software as described above allows for a "split-domain" mode of verification in which only the low-level code is executed by a simulated processor model, while the rest of the code executes externally to the simulator.

In an embodiment, an interface between the upper-level code executing externally, and the low-level code executing on the simulated processor is provided. The interface handles requests from the high-level code to the low-level code to perform work. A shared area in a model memory, accessible to both upper and lower-level code, is used to control execution of the lower-level code.

Because most of the verification software executes externally to the simulator, for example, on a workstation, while only the low-level code executes on the simulated processor, the overhead of performing the high-level functions noted above is removed from the simulator. Consequently, the number of simulator cycles required to execute a verification test is greatly reduced, while still allowing for realistic testing in which the processor model emits the I/O operations which will ultimately be performed by a physical implementation. As a result, faster verification and reduced time-to-market is enabled.

DETAILED DESCRIPTION OF THE INVENTION

In a preferred embodiment of the invention, a test operating system (TOS) is implemented in computer-executable instructions. The TOS has a hierarchical and partitioned structure which enables a simulation speed-up mode to be utilized when a SOC being verified includes an embedded processor core. In this "split-domain" speed-up mode, only low-level device driver (LLDD) code executes on a simulated processor, while higher-level code comprising test applications and test masters executes externally to the processor.

The TOS provides a framework for generating test cases to test an individual core and combinations of cores, including core combinations which are specific to a particular SOC design. The term "core" as used herein refers to a module of logic representing a circuit design of any degree of complexity, which may be used as a component of a SOC. In its developmental stages, a core is typically embodied as a simulatable HDL program written at some level of abstraction, or in a mixture of abstraction levels, which can describe the function of the core prior to its actual physical implementation in silicon. Major levels of abstraction that are generally recognized include a behavioral level, a structural level, and a logic gate level. A core may be in the form of a netlist including behavioral, structural and logic gate elements. Ultimately, after verification, design logic represented by a core is physically implemented in hardware.

Figure 1:
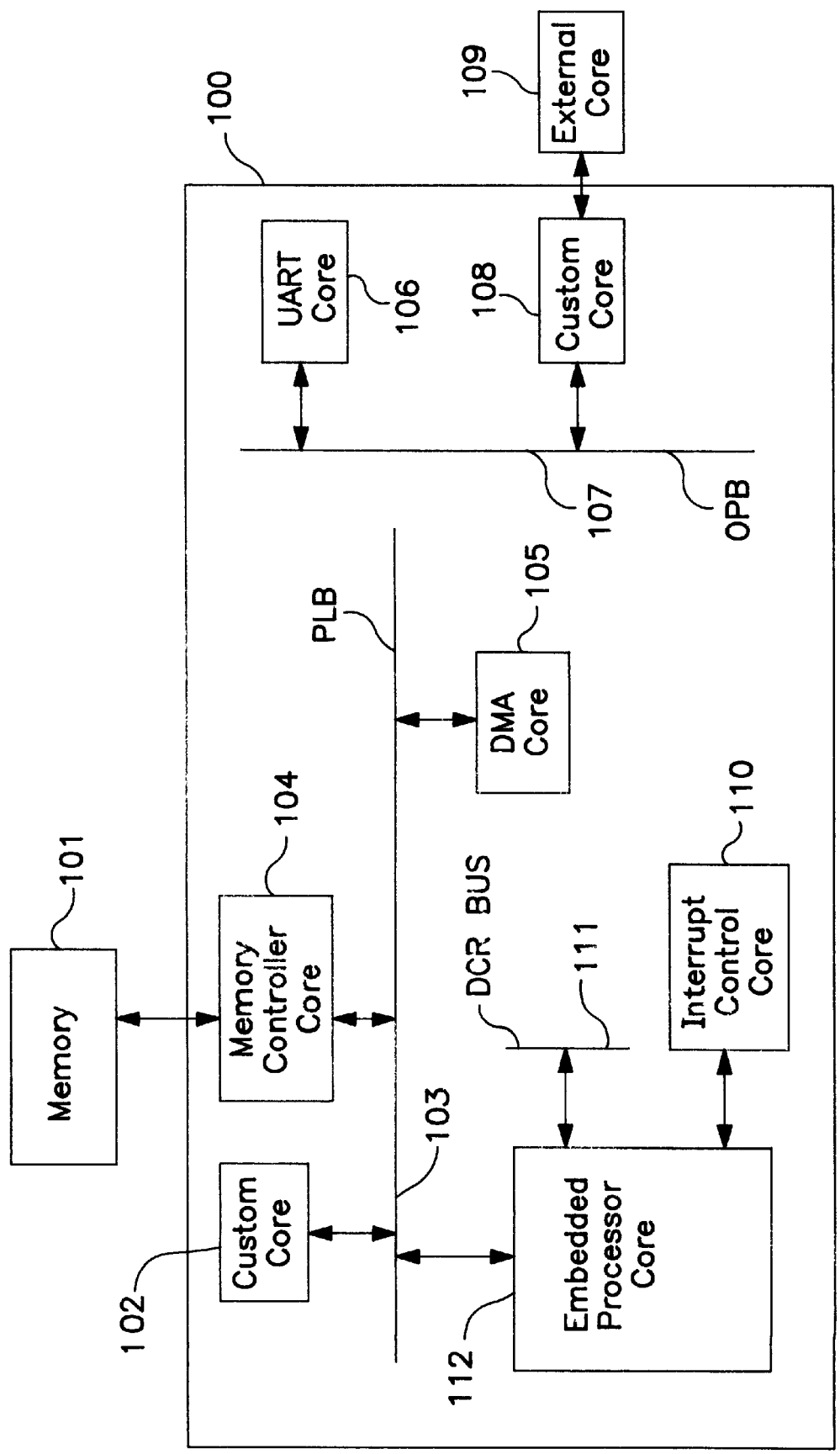
FIG. 1 shows an example of a system-on-chip (SOC) design.

FIG. 1 shows an example of components of a SOC design 100; the representation is intended to include embodiments in any known form of logic design, including simulatable HDL modules and netlists, and physical implementations. The SOC 100 includes a custom core 102 coupled to a processor local bus (PLB) 103, a memory controller 104 coupled to a memory core 101 and to the PLB, a Direct Memory Access (DMA) core 105 coupled to the PLB, a Universal Asynchronous Receiver Transmitter (UART) core 106 coupled to an on-chip peripheral bus (OPB) 107, a second custom core 108 coupled to a core 109 which is external to the chip, an interrupt control core 110 coupled to an embedded processor core 112 and a device control register (DCR) bus 111 coupled to the embedded processor core. Memory core 101 is also external to the SOC 100.

Custom cores 102 and 108 represent design logic tailored to a particular application of the SOC. Other cores, such as the UART and DMA cores, may have well-standardized embodiments (sometimes called Application-Specific Integrated Circuits or ASICs) which are widely available from vendors. Typically, the design of a SOC comprises a combination of such custom cores and ASICs.

Figure 2A:
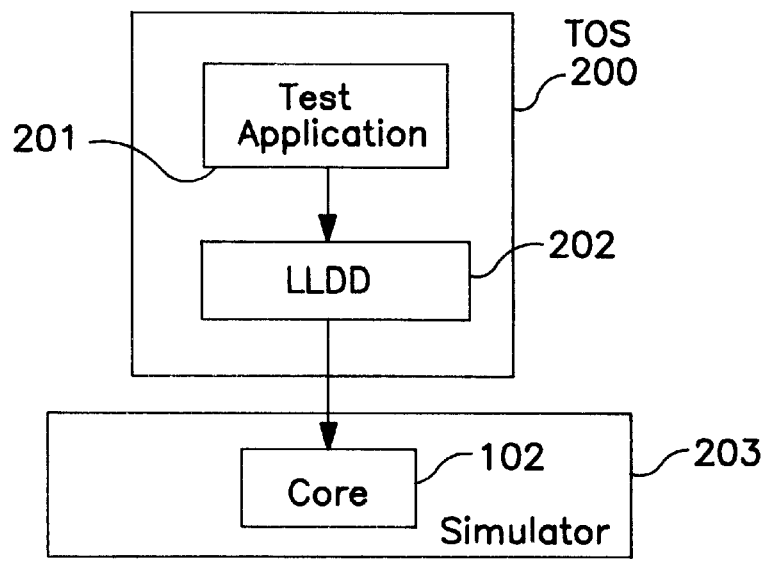
FIG. 2A shows a test application and low-level device driver (LLDD) applying a test case to a core.

As shown in FIG. 2A, to enable verification of a component core of a SOC design, the TOS 200 comprises at least a test application 201 which generates a test case which is applied by a low-level device driver (LLDD) 202 to a core; for example, custom core 102 implemented as an HDL module. Simulator 203 interprets HDL descriptions in the core 102 to simulate the behavior of a hardware device corresponding to the core, in response to the test stimulus.

The test case generated by the test application 201 typically takes the form of computer-executable instructions which generate stimuli to verify the core 102. The application of the test case typically produces, as output, results data representing the response of the simulated design which is compared to expected results, to determine whether the design functions as expected. The design may subsequently be revised to improve performance or de-bug errors.

Figure 2B:
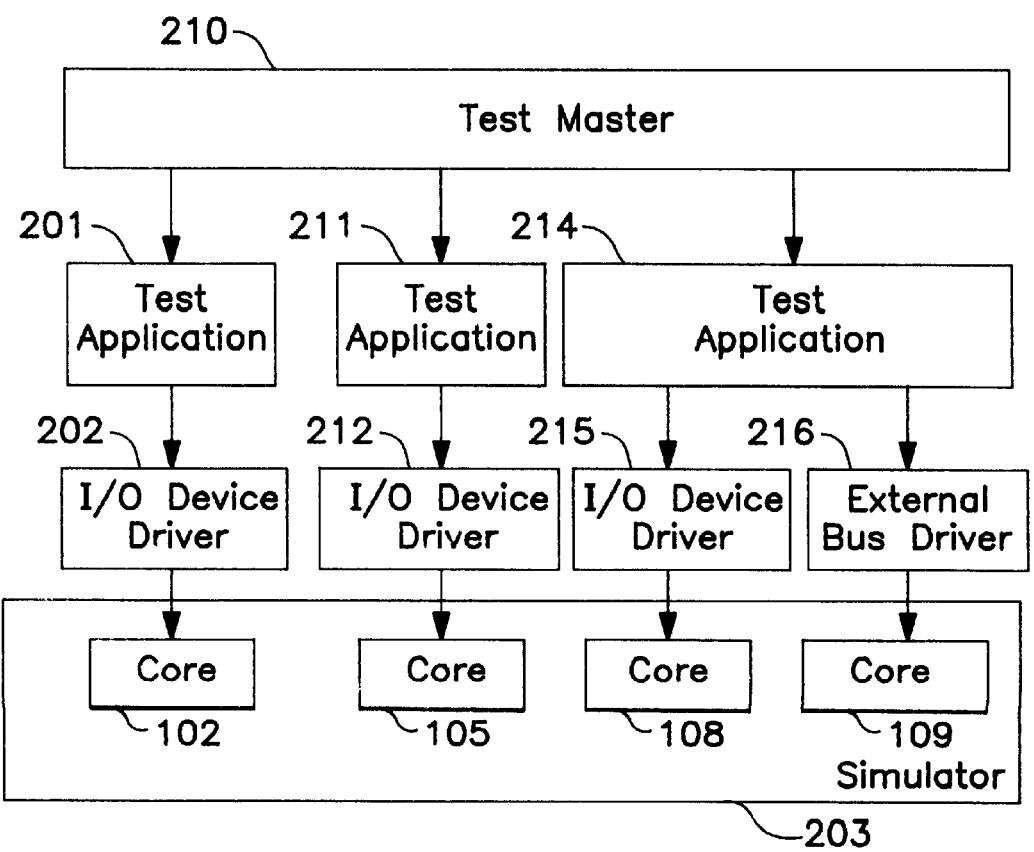
FIG. 2B shows a test master controlling a multi-core test.

A more general depiction of the TOS 200 is shown in FIG. 2B. The TOS 200 is hierarchically organized. An upper level of the TOS may comprise a test master 210 and a plurality of test applications such as test applications 201, 211 and 214 for testing a combination of cores. The upper-level code performs such functions as decision-making, test initialization, test randomization, multi-tasking, and comparison of test results with expected results.

FIG. 2B represents test applications 201, 211 and 214 executing under the control of a test master 210 in a multi-tasking environment. Test application and LLDD pairs are developed to test specific cores. Each test application corresponds to a particular core 102, 105, 108 and 109 being tested. As shown, the LLDDs may be, more particularly, I/O device drivers such as 202, 212 and 215 which perform operations on cores internal to the SOC 100, and external bus drivers such as 216 which perform operations on cores external to the SOC.

The LLDDs 202, 212, 215 and 216 of FIG. 2B represent a low level of the TOS 200. The LLDDs provide an interface between the higher-level software such as the test master and the test applications, and the core being simulated. Because the cores being simulated correspond to target hardware (i.e., the physical elements which will ultimately implement the design logic), operations on the cores occur on a hardware level. These operations are performed by the LLDDs, and include register I/O and interrupt handling. In an embodiment, the operations on the cores typically comprise DCR read and writes (i.e., read and writes to the processor's DCR bus), memory-mapped I/O, and memory reads and writes. A DCR bus 111 (see FIG. 1) is typically used in Power PC® architected processors for programming registers in peripheral cores. Memory-mapped I/O refers to a known technique of programming core registers using standard memory read and writes which are decoded to core register addresses.

Figure 3:
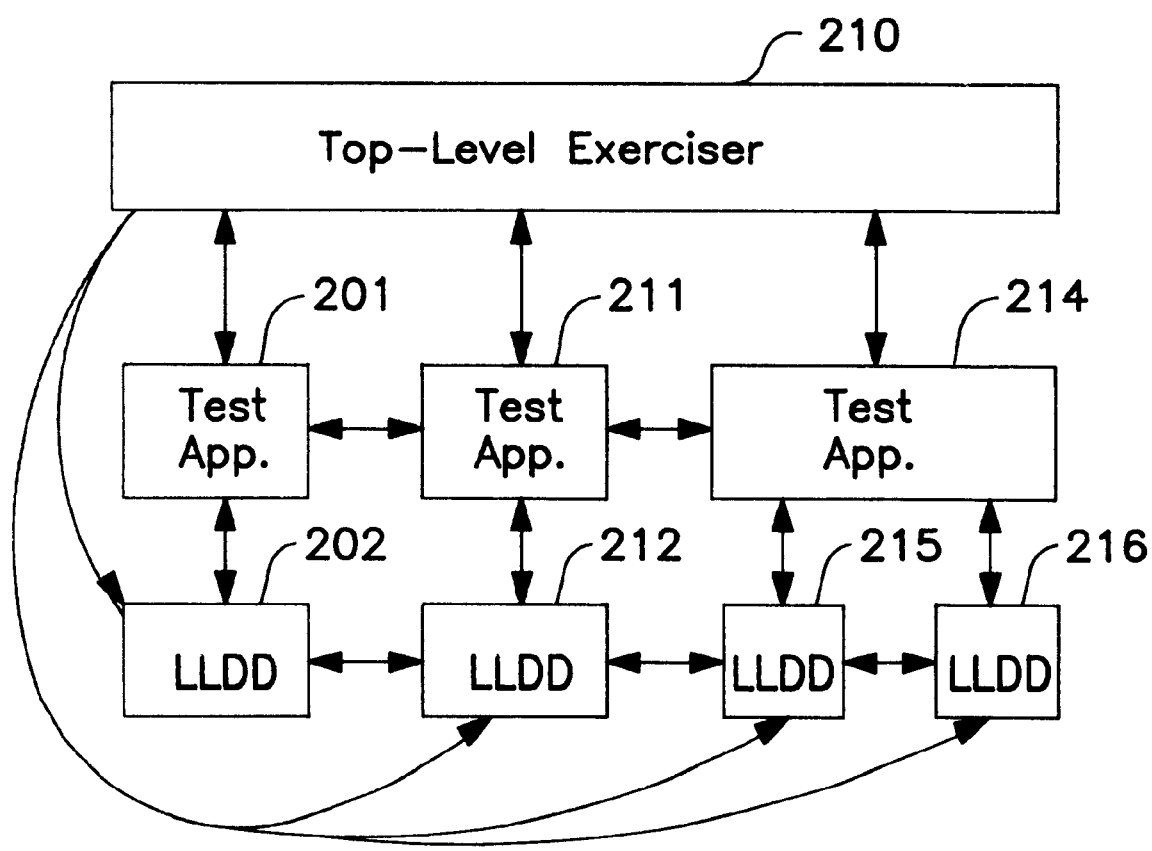
FIG. 3 shows a flow of communication in a test operating system (TOS) according to the present invention for controlling a multi-core test.

Components of the TOS including test applications and test masters may be designated "tasks" in an embodiment of the invention. Testing of multiple cores to simulate hardware interaction among SOC components is enabled in the TOS by a multi-tasking system. The multi-tasking system utilizes a hierarchically-organized communication and control system. Referring now to FIG. 3, according to this system, information (represented by directed lines) relating to a test is exchanged between a top-level exerciser such as test master 210 and test applications (for example, 201, 211 and 214 as shown); between test applications; to LLDDs (for example, 202, 212, 215 and 216) from a test application or test master; and between LLDDs. LLDDs communicate information related to operations on the core to their associated test applications.

Figure 4:
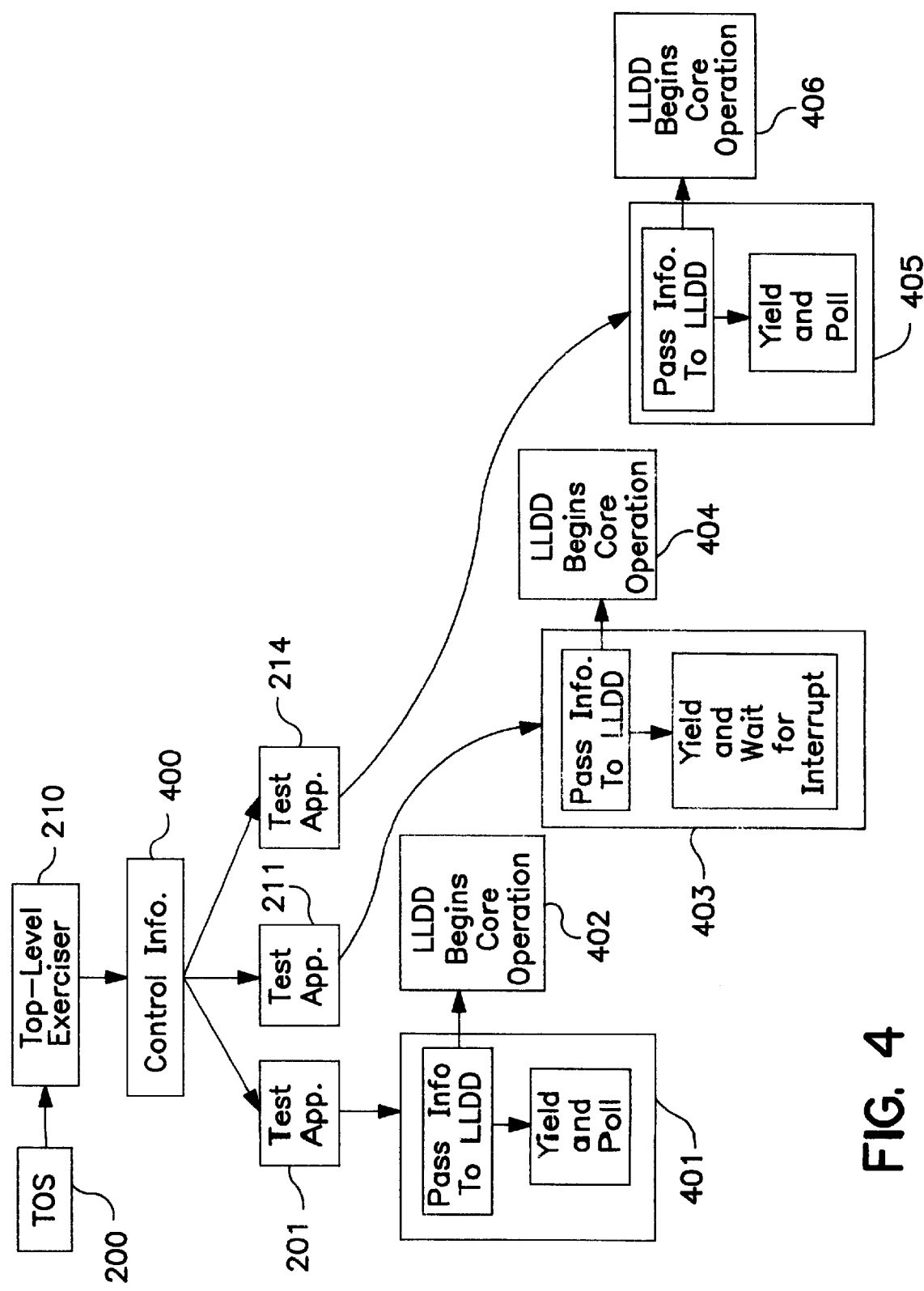
FIGS. 4 and 5 show an example of a flow of operations involved in executing a multi-core test.

The TOS manages the dispatching of test applications and LLDDs in response to the exchange of information. The general flow of multi-tasking operations by the TOS proceeds as illustrated in FIG. 4. First, a top-level exerciser task, for example, test master 2 as shown in FIG. 2B, is invoked by the TOS. The top-level exerciser task is user-defined and specifies a list of tests to be executed, selecting from available test applications and issuing user-specified control information for effecting a particular test case to be applied to a group of cores in a particular simulation session. It also configures the TOS for a given simulation session by defining, for example, an interrupt configuration for cores that support interrupts, and specifying randomization parameters and a default chip-specific initialization sequence.

The control information 400 from the top-level exerciser directs the test applications to apply a particular set of test cases, typically for simulating the interaction of a combination of cores. The TOS dispatches the test applications, in turn, and passes the control information to them.

When dispatched, each test application executes the specific test cases for its corresponding core as directed by the top-level exerciser, by passing control information to the LLDD that supports it. In FIG. 4, test application 201 is the first to be dispatched. Function block 401 shows test application 201 passing control information to its corresponding LLDD 202. Typically, executing a test case comprises applying a range of stimuli to simulated hardware design elements in the core. These stimuli are expressed at a high level in the control information passed by the test application, as directives to the LLDDs to perform some specified operation on the core; the LLDDs handle the detail of implementing the corresponding hardware-level operations on a core to apply the stimuli. Thus, a directive from a test application to an LLDD typically results in an operation on the simulated core hardware being initiated by the LLDD, as shown in block 402.

Once the LLDD begins its operation on the core, the test application gives up control, or yields. Typically, the yielding is done to allow another test application to be dispatched by the TOS and start up an overlapping operation on a core. Block 403 shows test application 211, dispatched by the TOS once test application 201 yields, issuing a directive to its corresponding LLDD 212, then yielding. The LLDD begins the operation as directed, as shown in block 404. Once test application 211 yields, test application 214 is dispatched, initiates an LLDD operation, and yields as shown in blocks 405 and 406. In an embodiment, once a test application has yielded as described above, there are two basic mechanisms for informing a test application of the completion of an operation by its corresponding LLDD: polling, and waiting for interrupts. Which mechanism is used depends upon the particular core. Custom core 102, for example, may require polling by the test application 201 as shown in block 401, while test application 211 waits for an interrupt from DMA core 105 as shown in block 403.

Polling for completion of an LLDD operation by the test applications is typically done by a DCR or memory read to a status register in the corresponding core (via the LLDD). Waiting for interrupts is performed by a program loop in the test application to check a status flag which is set by an interrupt as further discussed below.

Figure 5:
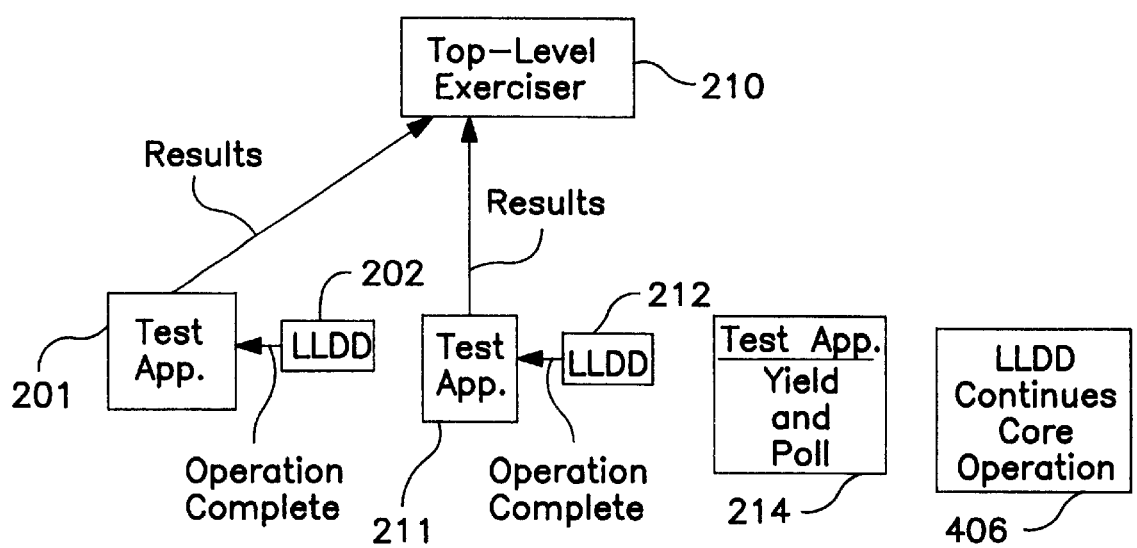

As shown in FIG. 5, once a test application is notified that an operation by its supporting LLDD has completed, the test application checks the result and passes it back to the top-level exerciser for some user-specified usage, for example, tracing and logging for comparison with expected results. FIG. 5 shows test applications 201 and 211 having received completion information from their respective LLDDs, and returned results to the top-level exerciser. Test application 214 is still in a yield and poll loop, as its LLDD continues it operation on its associated core.

The yielding mechanism described above supports multi-tasking by the TOS. When an LLDD has started a low-level operation on a core, the corresponding test application yields to allow another test application to start. This enables overlapping operations, so that a realistic mix of activity, including complex interactions among the cores, may be simulated. For example, FIG. 4 represents four cores, cores 102, 105, 108 and 109 being exercised concurrently. Because the test applications are controlled by the same top-level exerciser, communication between the cores can be simulated.

Synchronization of test applications with cores which are external to the SOC design, such as core 109, is accomplished with an External Memory-Mapped Test Device (EMMTD) (not shown). The external memory-mapped test device (EMMTD) is coupled between a SOC design being tested in simulation, and cores external to the SOC design. The EMMTD is coupled to the SOC via a chip-external bus, and coupled to external cores, or to the external interfaces of cores internal to the SOC, via an EMMTD output bus.

The EMMTD processes signals received over the chip external bus and applies them to an external core, or to an internal core with an external interface, coupled to the EMMTD output bus. Internal logic in the EMMTD provides for control and status monitoring of a core coupled to the EMMTD output bus by enabling functions including driving data on the bus, reading the current state of data on the bus, and capturing positive and negative edge transitions on the bus.

In an embodiment, the communication and control system for enabling multi-tasking may comprise "message" and "callback" functions as described below. It is noted that the function names described hereinafter are arbitrary and merely representative of functionality which could be implemented in a wide variety of computer instruction sequences invoked by arbitrarily-assigned mnemonics. WAIT_MESSAGE, for example, is a function used by tasks to receive a message which may include control information from a higher level relating to the performance of a test. When a task has called WAIT_MESSAGE, it is considered available, and is not called again until a message is to be delivered to it. When a message is delivered, the task is re-activated and performs the work required by the message.

A YIELD directive causes a task to give up control when issued. The directive is typically used by a test application, once it has directed its corresponding LLDD to perform some hardware-level operation on a simulated core, to give up control to another test application. This enables multi-tasking for realistic simulation of multiple core interaction. Yielded tasks stay on the TOS dispatch schedule and are re-invoked periodically to poll for completion of an operation by their corresponding LLDDs.

Additional messaging and control functions provided by the TOS include a POST_MESSAGE function, which schedules a specified task to run. When the task does run, it is passed specified messages and test parameters from a top-level exerciser, POST_MESSAGE is typically used by the top-level exerciser to schedule many simultaneous tests to begin executing.

A SEND_MESSAGE function also schedules a task to run, but unlike the case with POST_MESSAGE, the sending task may not run until the receiving task processes the message specified in SEND_MESSAGE and returns to WAIT_MESSAGE. This guarantees that the specified message will be processed before other work is done by the receiving task.

A TASK_AVAILABLE function is used by a top-level exerciser to determine if a task is available to receive a message or whether it has completed its work.

Tasks use a DRIVER_MESSAGE function to invoke LLDDs, and LLDDs use an APP_CALLBACK function to return from some hardware-level operation on a simulated core to the test application which invoked them. LLDDs use a DRIVER_CALLBACK or DRIVER_MESSAGE function to communicate with each other.

It is noted that the above-functions typically take, as arguments, parameters and associated data type definitions which have not been explicitly shown. Thus, a complete specification of a POST_MESSAGE directive might appear as, for example, POST_MESSAGE(TOSTASK task, TOSMSG message, TOSPARMS parameters), where the TOSTASK specification indicates that the value which follows is a task identifier, and TOSMSG denotes that the value which follows is a message identifier. TOSPARMS indicates a pointer-to-message structure. Message structures are associated with specific messages to carry supplemental data. Messages and message structures are user-defined and specify the capabilities of a test application and the parameters needed to execute tests. A top-level exerciser typically creates as many message structures as needed to communicate with each test application in a given simulation session.

Figure 6:
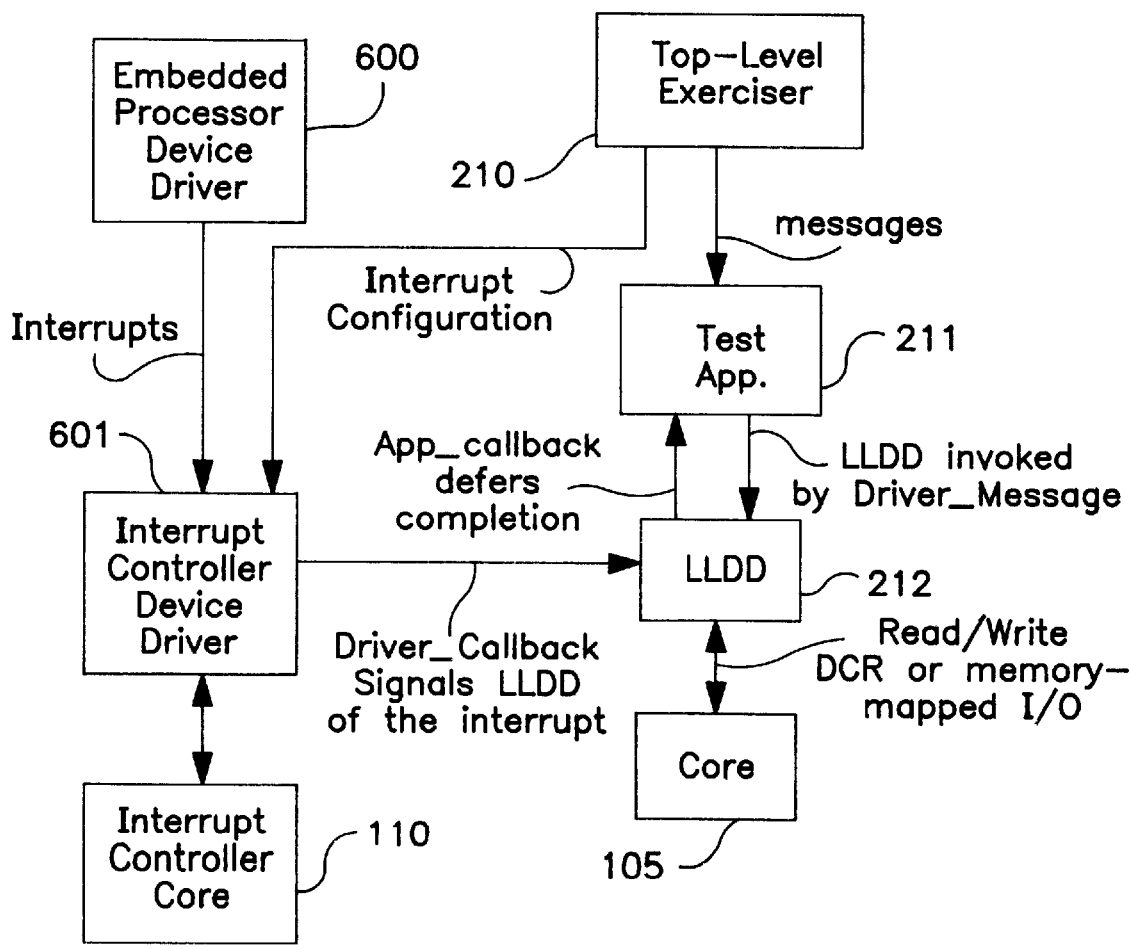
FIG. 6 shows interrupt handling by the TOS.

In view of the above description, interrupt handling by the TOS may now be described with greater particularity in terms of the functions invoked. Referring now to FIG. 6, a top-level exerciser 210 configures an interrupt controller device driver (ICDD) 601 with an interrupt configuration for those cores being exercised which support hardware interrupts, for example, DMA core 105. The top-level exerciser issues POST_MESSAGE to post control messages to test application 211 and then YIELDs. The top-level exerciser may subsequently issue a TASK_AVAILABLE function to determine when the test application has completed its work.

In response to the message from the top-level exerciser, the test application 211 invokes its corresponding LLDD 212 by issuing a DRIVER_MESSAGE function to invoke some operation by the LLDD on the associated core 105, and YIELDs so that the TOS may dispatch other tasks.

The LLDD 212 performs the specified hardware-level operation on the core 105 by issuing function calls to perform reads or writes to the DCR bus, memory-mapped I/O, or a memory access. In the meantime, the test application loops to check an internal 5 status flag set by an interrupt to indicate completion of the operation.

When the operation by the LLDD is complete, a hardware interruption is posted by the core which causes the embedded processor device driver 600 to be invoked through a corresponding interrupt vector. The embedded processor driver then invokes the ICDD 601 to determine which core posted the interrupt.

LLDDs for cores that support interrupts include an interrupt handler function which is invoked by the ICDD using DRIVER_CALLBACK. The interrupt handler function reads registers in the core, for example DMA core 105, to determine what kind of interrupt occurred (typically, completion of the operation initiated by the test application), and issues APP_CALLBACK to notify its controlling test application 211 of the interrupt. APP_CALLBACK sets the status flag which is being checked by the test application in its wait-for-interrupt loop. The test application checks the result of the hardware-level operation and returns the result to the top-level exerciser 210.

Figure 7A:
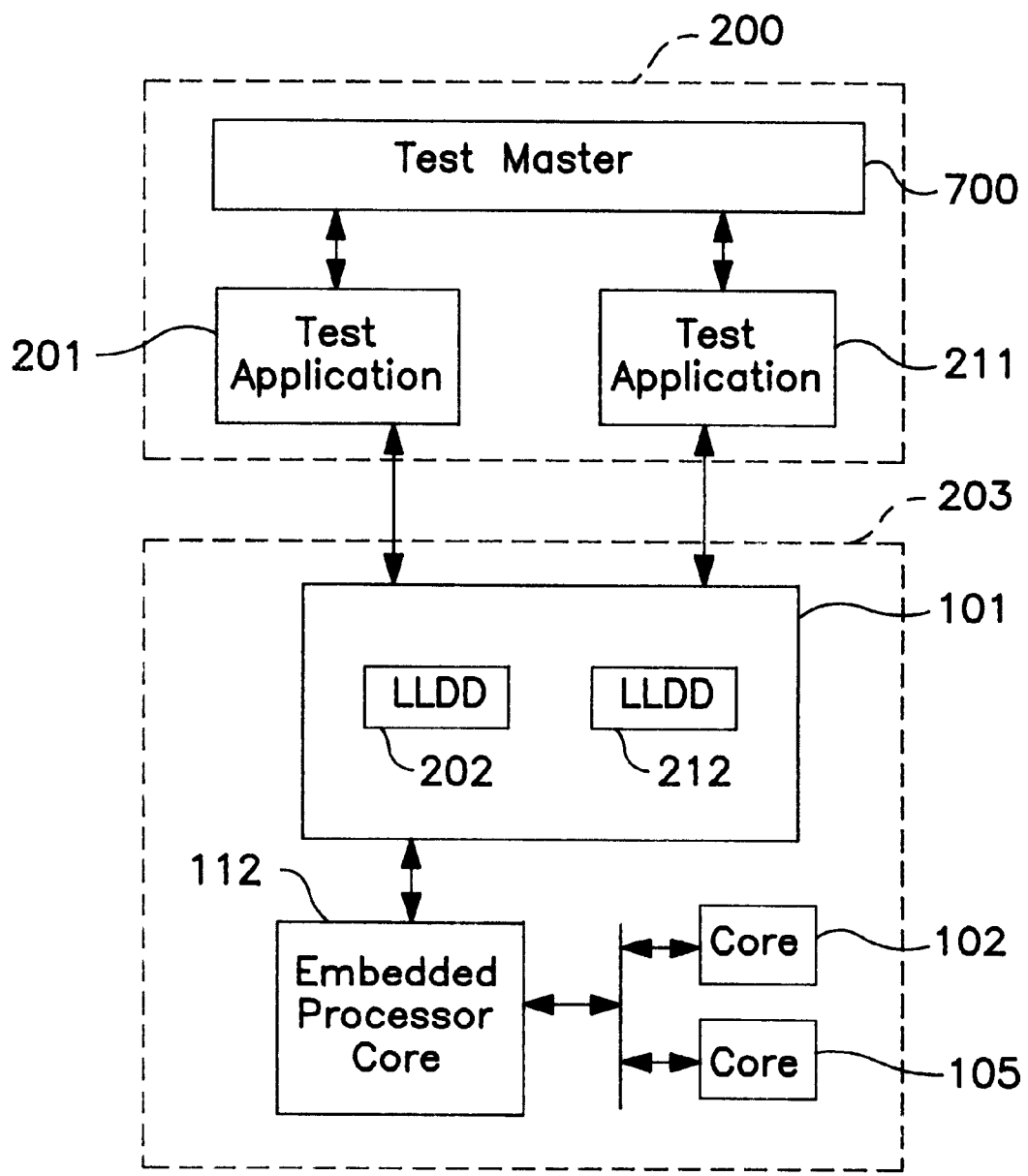
FIGS. 7A and 7B show an example of the TOS according to the present invention executing in a "split-domain" mode for speed-up of verification.

In split-domain mode, as noted above, the LLDDs are compiled to execute on the simulated embedded processor 112, while the higher-level code, i.e., the test applications and test master, execute externally to the simulator, for example, on a workstation driving the simulation. FIG. 7A shows a high-level representation of an example of a TOS test case being applied in the split-domain speed-up mode. Test master 700 (in this case, a different test master from 210, exercising only cores 102 and 105) and test applications 201 and 211 execute externally to the simulator 203. LLDDs 202 and 212, on the other hand, are loaded into the simulated memory core 101 and are executed by the simulated processor core 112 to perform I/O operations on cores 102 and 105, respectively.

Figure 7B:
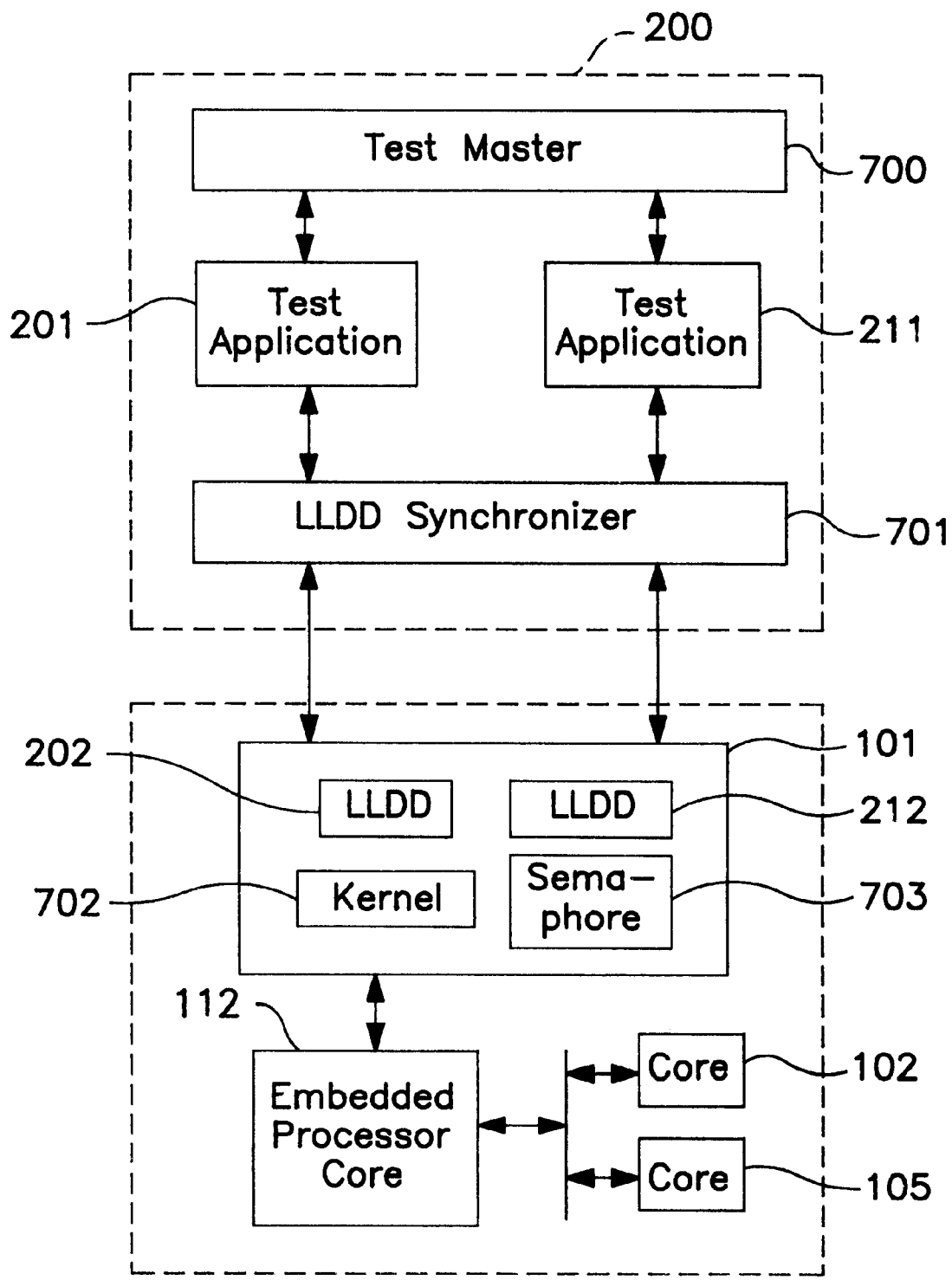

As shown in FIG. 7B, in order to provide for communication between the LLDDs and the higher-level code executing externally to the simulator, the simulated memory core 101 includes a shared memory area, semaphore 703, accessible to both the test master/test applications and the LLDDs, for the exchange of information as described above. The semaphore 703 comprises fields for holding control information generated by the upper-level TOS code executing externally, for initiating work by the low-level device drivers executing in the simulator. A kernel 702 for controlling test execution comprising a "split-domain TOS" (SD-TOS) subset of the TOS is also provided internally to the simulator in the memory core 101. The kernel 702 executes a loop to read the control information in the semaphore, to determine which LLDDs have been assigned work by their corresponding test applications, and what kind of operations the LLDDs are to perform.

The split-domain mode may further utilize an LLDD synchronizer component 701 executing externally to the simulator 203. Multi-tasking of test applications as described above occurs in the upper level code executing externally to the simulator, but in a preferred embodiment the LLDDs are not multi-tasked, in order to simplify the kernel 702. That is, LLDDs do not YIELD as described above; once invoked, a LLDD executes until its assigned operation is complete. The LLDD synchronizer suspends execution of the test applications to ensure that a LLDD operation invoked by one test application (for example, an operation by LLDD 212 to start a data transfer by DMA core 105) completes before a second test application is dispatched. Without the serialization of LLDD operations, requests for LLDD operations would queue up on the simulation side, necessitating more complex code for handling them. Synchronization among the LLDDs by the synchronizer 701 to ensure their operations do not overlap removes the overhead of multi-tasking from the kernel 702 to improve simulation throughput.

Figure 8:
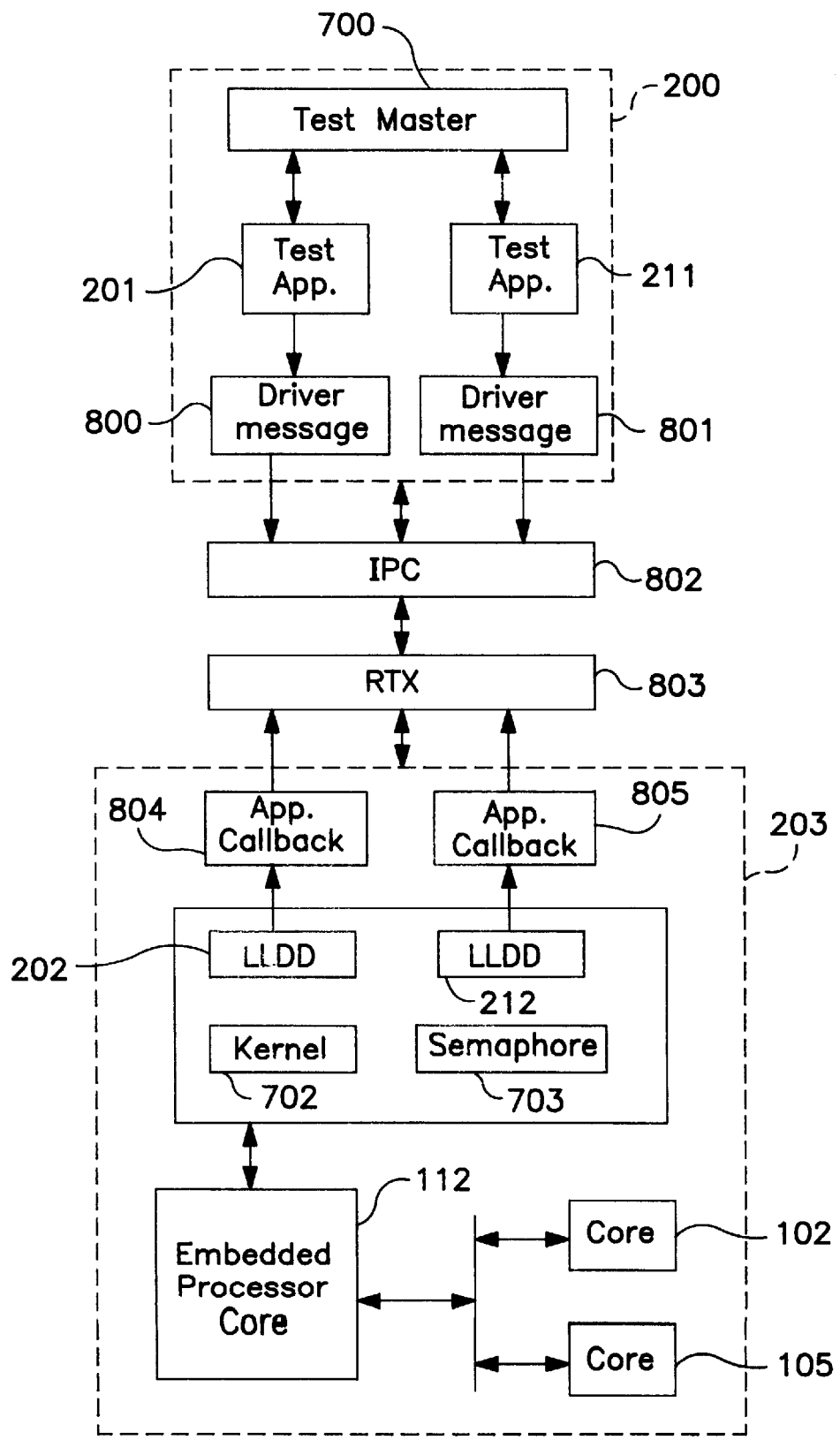
FIGS. 8 shows additional elements used for the split-domain mode of verification.

FIG. 8 illustrates additional elements for implementing the split-domain speedup mode corresponding to the example of FIGS. 7A–7B. (LLDD synchronizer 701 is not shown). In an embodiment, the TOS 200 and the simulator 203 may constitute two separate UNIX® processes running on a workstation. (UNIX operating systems are well-known and documented and their features are not further described herein.) The split-domain speed-up mode may utilize a TOS-to-simulator interface comprising an inter-process communication (IPC) layer 802 and a run-time executive (RTX) 803 which handle the exchange of information, represented by DRIVER_MESSAGEs 800 and 801 and APP_CALLBACKs 804 and 805, between the LLDDs and the higher-level code. The RTX comprises object-oriented programs for, among other things, handling requests from the TOS 200 to access the simulator 203. The IPC layer comprises a combination of RTX code and UNIX code which utilizes a "C" API (application program interface) provided by a UNIX operating system to perform inter-process communication.

In split-domain mode, during start-up for a particular simulation session, the simulator 203 invokes the RTX 803 to perform environment initialization. In this initialization, the RTX sets up the IPC 802 for communicating with the TOS 200, then "spawns off" (starts) a new UNIX process and starts the TOS on it.

Figure 9A:
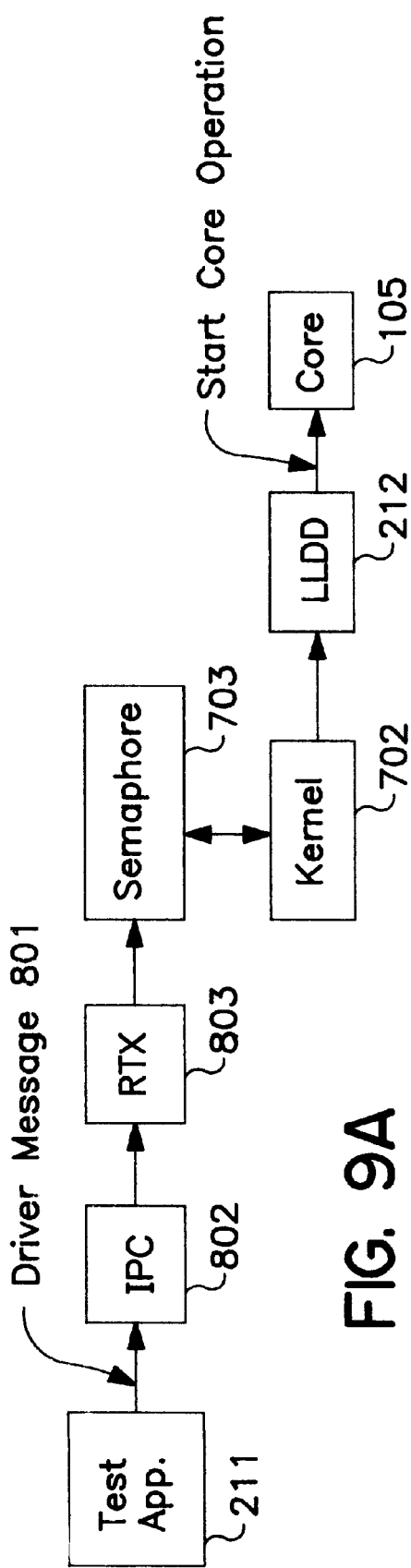
FIGS. 9A–9C show a flow of communication between a test application and a low-level device driver according to the TOS in split-domain mode.

Typically, the TOS executing externally to the simulator begins a multi-tasked test as described above. As illustrated in FIG. 9A, when a test application such as 211 issues a request in the form of a DRIVER_MESSAGE 801 to its corresponding LLDD 212 to direct it to perform some hardware-level operation on a core 105, the IPC layer 802 is invoked, sends the DRIVER_MESSAGE to the RTX 803 and waits for the RTX to indicate that the DRIVER_MESSAGE has been serviced.

Figure 10:
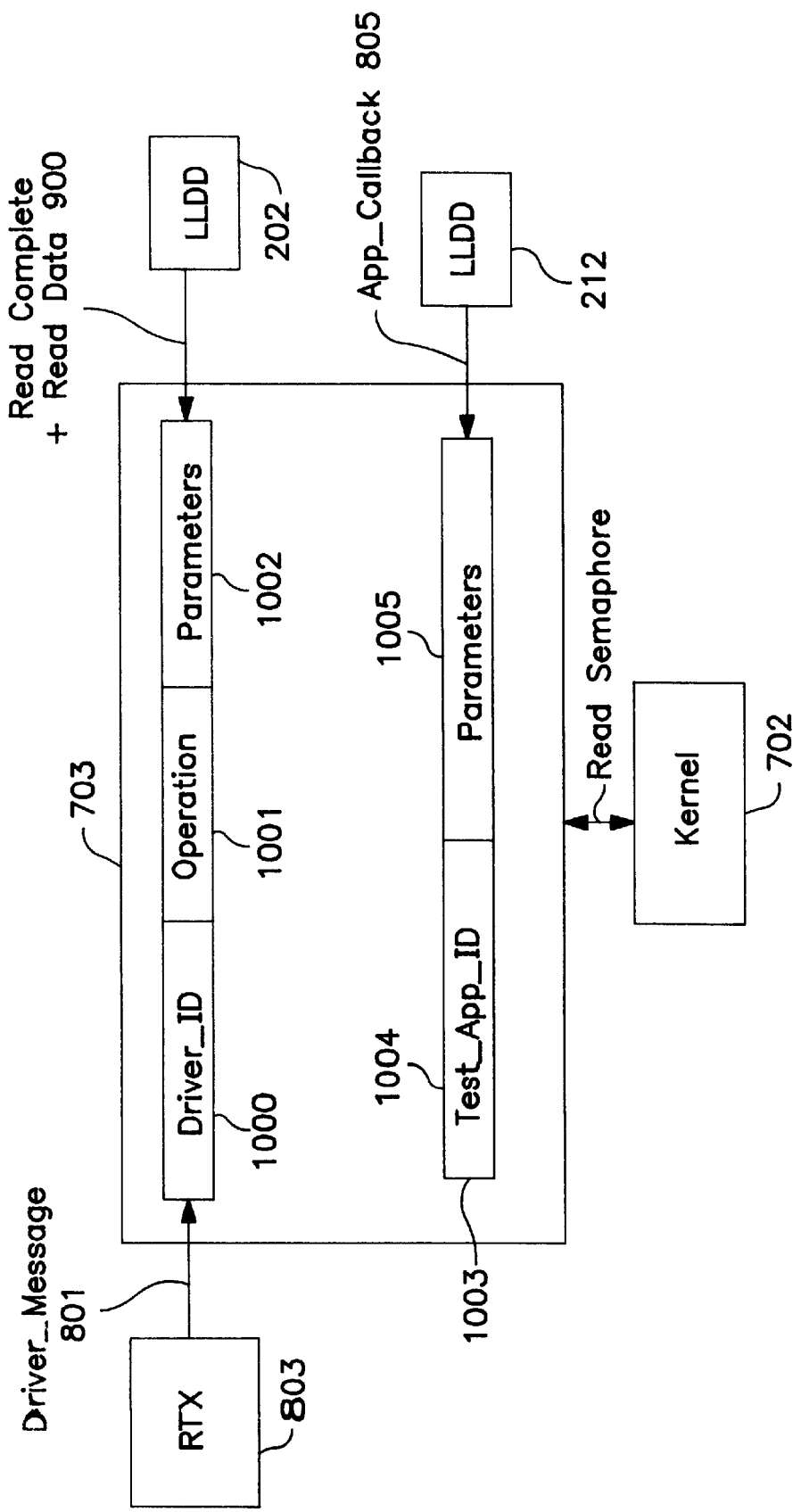
FIG. 10 shows a shared semaphore area in a memory for enabling split-domain mode.

As shown in FIG. 10, the RTX writes the DRIVER_MESSAGE, which typically contains a field 1000 identifying the target LLDD, a specified operation field 1001 and a parameter field 1002, to the semaphore 703, and the kernel 702 determines which LLDD to call by reading the semaphore 703. As shown in FIG. 9A, the kernel then invokes the corresponding LLDD 212, passing it a specified operation to perform and a pointer to parameters in the DRIVER_MESSAGE 801 contained in the semaphore 703. For example, to request the LLDD to perform a write to the DCR bus, the parameters would specify a target address and data to write.

The semaphore 703 further comprises a field 1003 for registering APP_CALLBACKs resulting from an interrupt, which would typically include a TEST_APP_ID field 1004 identifying the test application to call back, and a parameter field 1005 which would further describe the type of interrupt that occurred.

Figure 9B:
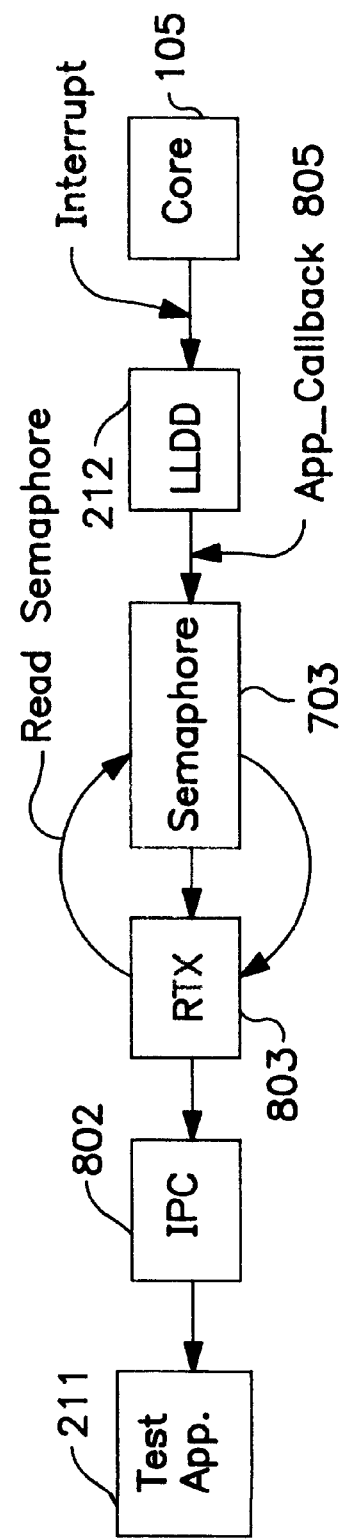

As shown in FIG. 9B, to handle interrupts issuing, for example, from the completion of an LLDD operation on its associated core as described above, the RTX 803 reads the semaphore 703 every simulator cycle. When the core generates an interrupt (communicated to its LLDD by the mechanism described above utilizing the ICDD 601, not shown), the LLDD 212 writes an APP_CALLBACK 805 to field 1003 in the semaphore 703 as shown in FIG. 10, which is detected by the RTX 803. In response, the RTX invokes the IPC layer 802, which passes the APP_CALLBACK to the corresponding test application 211.

Figure 9C:
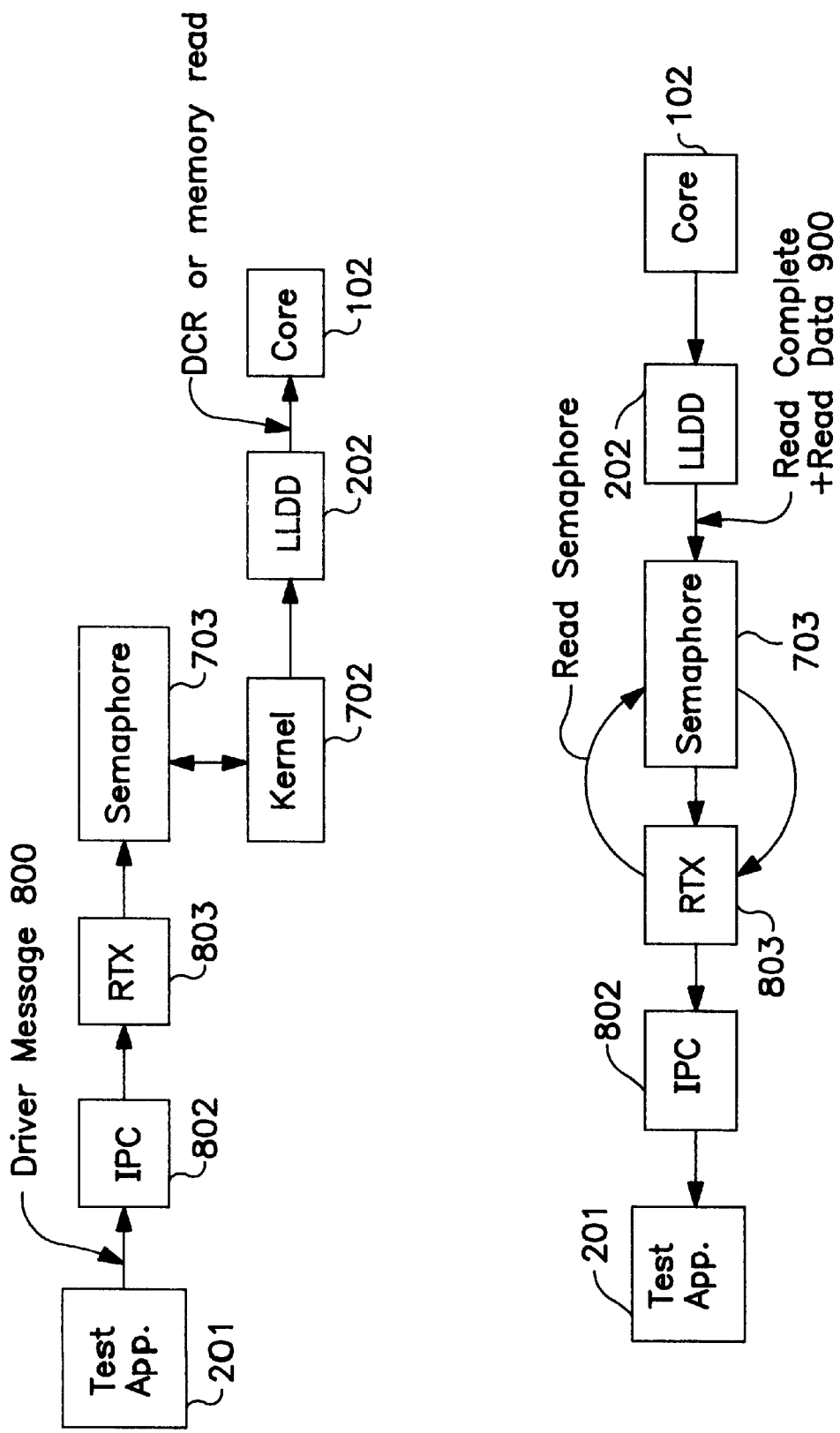

FIG. 9C shows polling of a core as described above, in split-domain mode. A test application such as 201 issues DRIVER_MESSAGE 800 to its corresponding LLDD 202, which is written to the semaphore 703 via the IPC layer 802 and RTX 803. The kernel 702 retrieves the DRIVER_MESSAGE from the semaphore and sends it to the appropriate LLDD 202. In response, the LLDD performs a DCR or memory read as described above to a status register in the core 102. When the read operation is complete, the LLDD writes the read data 900 into the parameter field for the corresponding DRIVER_MESSAGE in the semaphore, and a flag to indicate that the read is complete (also shown in FIG. 10). The RTX detects the completion of the operation via its read loop of the semaphore, and copies the parameters back across the IPC layer to the invoking test application.

To pace the TOS executing externally at workstation speed with the portion of the TOS executing in the much-slower simulator, a TOS scheduler loop may be called within test applications that are waiting for interrupts. The scheduler loop is called from within a waiting-for-interrupt loop. The scheduler loop invokes the IPC layer to request the RTX to run a specified number of cycles before returning to the invoking test application. This has the effect of pausing the external TOS while the simulator executes cycles, so that the test application will not time-out prematurely while it is waiting for an interrupt.

It may be appreciated from the foregoing that the TOS split-domain mode of execution provides for a significant reduction in verification time. Most of the verification software, i.e., the high-level control software, executes at workstation speed externally to the simulator, while only the low-level code executes on the simulated processor. Thus, the overhead of performing the high-level functions noted above is removed from the simulator, while still assuring processor emission of I/O operations and inclusion of the processor in a test case. Consequently, the number of simulator cycles required to execute a verification test is greatly reduced, while allowing for realistic testing in which the processor model emits the I/O operations which will ultimately be performed by a physical implementation. As a result, faster verification and reduced time-to-market is enabled.

Figure 11:
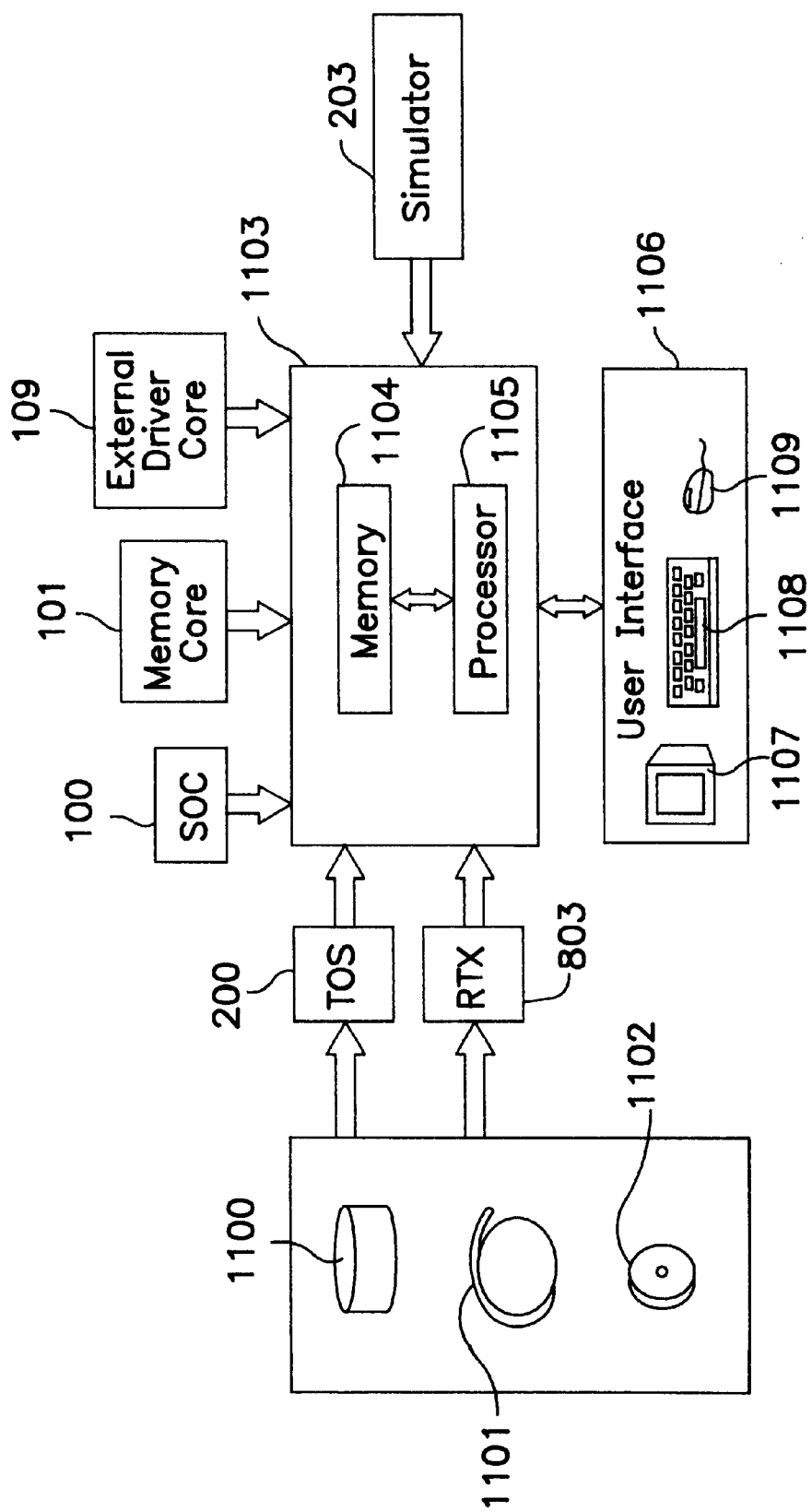
FIG. 11 shows a general purpose computer system for practicing the invention.

FIG. 11 illustrates a general purpose computer system which can be used to practice the invention. The system includes a computer 1103 comprising a memory 1104 and a processor 1105 which may be embodied, for example, in a workstation. The system further includes a user interface 1106 comprising a display device 1107 and user-input devices such as a keyboard 1108 and mouse 1109 for purposes of, for example, initiating and controlling a simulation session and observing simulation status and results.

The TOS 200 and RTX 803, as noted above, may be implemented as computer-executable instructions which may be stored on a computer-usable medium such as disk 1100, tape 1101 or CD-ROM 1102. The instructions may be read from a computer-usable medium as noted into the memory 1104 and executed by the processor 1105 to effect the advantageous features of the invention.

The simulator 203 may be any of a variety of commercially-available simulators, including event simulators, cycle simulators and instruction set simulators. The simulator may run on the same workstation 1103 as the TOS. The TOS 200 and simulator 203 may be, for example, two distinct UNIX processes as described above, executing concurrently on the workstation.

Typically, additional inputs to the computer 1103 would include the SOC 100 being verified and external cores such as the memory core 101 and external driver core 109, embodied as simulatable HDL modules. The processor 1105 would execute the simulator (simulation software) 203, which would use the input simulatable modules to simulate the behavior of corresponding hardware devices in response to instructions executed by the TOS 200.

As noted above, in a preferred embodiment, the computer-executable instructions which implement the TOS 200 and RTX 803 are written in a high-level language such as C or C++, respectively. However, the programming structures and functionality disclosed herein for practicing the invention may find specific implementations in a variety of forms using other programming languages, which implementations are considered to be within the abilities of a programmer of ordinary skill in the art after having reviewed the specification.

The foregoing description of the invention illustrates and describes the present invention. Additionally, the disclosure shows and describes only the preferred embodiments of the invention, but it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

The invention claimed is:

1. A method for verifying a system-on-chip integrated circuit design comprising a plurality of design components, including the steps of:
    partitioning verification software into control and device driver levels of software, said control level for generating a test case to be applied to a component of said design, and said device driver level for applying said test case to said component in simulation under the control of said control level;
    using a simulator to simulate a processor which executes said device driver level of software; and
    executing said control level of software externally to said simulator.

2. The method of claim 1, said control level of software comprising a first level which generates a test case to be applied to a specific component of said design, said device driver level applying said test case to said specific component under the control of said first level.

3. The method of claim 2, said control level of software further comprising a second level which controls said first level and said device driver level to perform verification of a combination of said design components.

4. The method of claim 1, wherein said control level of software controls multi-tasking by said first level, and said device driver level performs hardware-level operations including register I/O and interrupt handling on said component in simulation.

5. The method of claim 1, wherein said device driver level of software is loaded into a memory simulated by said simulator.

6. The method of claim 5, said memory including a software kernel and a shared area accessible by both of said control and device driver levels of software, for controlling the execution of said device driver level of software.

7. The method of claim 6, wherein said executing step comprises:
    providing an interface between said control level and said simulator for allowing communication therebetween; and
    issuing a request from said control level to said device driver level to perform a specified operation on said component, said request invoking said interface which writes said request to said shared area to initiate said operation.

8. The method of claim 7, wherein said kernel reads said request and directs it to a corresponding device driver to initiate said operation.

9. The method of claim 7, wherein said device driver level writes to said shared area to indicate a status of said operation, and software in said interface reads said shared area to determine said status and relay it to said control level.

10. The method of claim 1, wherein said control level of software and said simulator execute on two distinct UNIX processes.

11. A computer-usable medium storing computer-executable instructions which when executed perform a process of verifying a system-on-chip integrated circuit design comprising a plurality of design components, said process comprising the steps of:
    (a) executing a control level of software for generating a test case to be applied to a component of said design;
    (b) executing a device driver level of software which applies said test case to said component in simulation under the control of said control level;
    wherein: said device driver level is executed by a processor simulated in a simulator; and
        said control level of software executes externally to said simulator.

12. The computer-usable medium of claim 11, said control level of software comprising a first level which generates a test case to be applied to a specific component of said design, said device driver level applying said test case to said specific component under the control of said first level.

13. The computer-usable medium of claim 12, said control level of software further comprising a second level which controls said first level and said device driver level to perform verification of a combination of said design components.

14. The computer-usable medium of claim 11, said computer-executable instructions implementing a software kernel and a shared area accessible by both of said control and device driver levels of software, for controlling the execution of said device driver level of software.

15. The computer-usable medium of claim 14, wherein said control level issues a request to said device driver level to perform a specified operation on said component, said request invoking an interface which writes said request to said shared area to initiate said operation.

16. The computer-usable medium of claim 15, wherein said kernel reads said request and directs it to a corresponding device driver to initiate said operation.

17. The computer-usable medium of claim 16, wherein said device driver level writes to said shared area to indicate a status of said operation, and software in said interface reads said shared area to determine said status and relay it to said control level.

18. A system for verifying a system-on-chip integrated circuit design comprising a plurality of design components, comprising:
   a workstation;
   a simulator which executes on said workstation and simulates said design components; and
   verification software which executes on said workstation, said verification software being partitioned into control and device driver levels of software;
   wherein:
      said control level executes externally to said simulator, and generates a test case to be applied to a component of said design; and
      said device driver level is executed by a processor simulated by said simulator, and applies said test case under the control of said control level to a component being simulated.

19. The system of claim 18, said control level of software comprising a first level which generates a test case to be applied to a specific component of said design, said device driver level applying said test case to said specific component under the control of said first level.

20. The system of claim 19, said control level of software further comprising a second level which controls said first level and said device driver level to perform verification of a combination of said design components.

21. The system of claim 19, wherein said control level of software controls multi-tasking by said first level, and said device driver level performs hardware-level operations including register I/O and interrupt handling on said component in simulation.

22. The system of claim 19, wherein said device driver level of software is loaded into a memory simulated by said simulator.

23. The system of claim 22, said memory including a software kernel and a shared area accessible by both of said control and device driver levels of software, for controlling the execution of said device driver level of software.

24. The system of 23, further comprising:
   an interface between said control level and said simulator for allowing communication therebetween;
   wherein a request issued from said control level to said device driver level to perform a specified operation on said component invokes said interface to write said request to said shared area to initiate said operation.

25. The system of claim 24, wherein said kernel reads said request and directs it to a corresponding device driver to initiate said operation.

26. The system of claim 24, wherein said device driver level writes to said shared area to indicate a status of said operation, and software in said interface reads said shared area to determine said status and relay it to said control level.

* * * * *